United States Patent [19]
Kern et al.

[11] Patent Number: 5,615,329
[45] Date of Patent: Mar. 25, 1997

[54] REMOTE DATA DUPLEXING

[75] Inventors: Robert F. Kern; William F. Micka, both of Tucson, Ariz.; Claus W. Mikkelsen, San Jose, Calif.; Michael A. Paulsen; Robert W. Shomler, both of Morgan Hill, Calif.

[73] Assignee: International Business Machines Corporation, Armonk, N.Y.

[21] Appl. No.: 199,448

[22] Filed: Feb. 22, 1994

[51] Int. Cl.$^6$ ................................................. G06F 11/00
[52] U.S. Cl. ..................................................... 395/182.04
[58] Field of Search ............................. 395/575, 182.04, 395/182.05; 371/10.2; 364/245.3, 268.5, 269.2

[56] References Cited

U.S. PATENT DOCUMENTS

| | | | |
|---|---|---|---|
| 3,623,014 | 11/1971 | Doelz et al. | 340/172.5 |
| 4,701,845 | 10/1987 | Andreasen et al. | 364/200 |
| 4,958,273 | 9/1990 | Anderson et al. | 364/200 |
| 5,051,887 | 9/1991 | Berger et al. | 364/200 |
| 5,155,845 | 10/1992 | Beal et al. | 395/575 |
| 5,212,784 | 5/1993 | Sparks | 395/575 |
| 5,241,668 | 8/1993 | Eastridge et al. | 395/575 |
| 5,241,669 | 8/1993 | Cohn et al. | 395/575 |
| 5,241,670 | 8/1993 | Eastridge et al. | 395/575 |
| 5,446,871 | 8/1995 | Shomler et al. | 395/180 |
| 5,491,788 | 2/1996 | Cepulis et al. | 395/182.11 |
| 5,504,861 | 4/1996 | Crockett et al. | 395/182.11 |
| 5,530,855 | 6/1996 | Satoh et al. | 395/600 |

OTHER PUBLICATIONS

R. Shomler, "RealTime Dasd Data Copy For Disaster Recovery" Nov. 93, Enterprize Systems Journal, pp. 92–100.

Edge: Work–Group Computing Report, Feb. 3 1992 v3 n89, p6(7) "Mainframe Storage: extended Storage architecture is key to Iceberg Capabilities".

Midrange Systems, Jul. 13, 1993 v. 6, n13 p5(5)(12), "What is the key issue confronting storage purchases today?", Krivda, C.D.

*Primary Examiner*—Robert W. Beausoliel, Jr.
*Assistant Examiner*—Stephen C. Elmore
*Attorney, Agent, or Firm*—F. E. Anderson; R. M. Sullivan

[57] ABSTRACT

A remote data shadowing system provides synchronous, storage based, real time disaster recovery wherein a secondary site is located remote from the primary site. An error recovery program at the primary site quiesces applications running thereat for performing error recovery procedures and signalling both primary and secondary locations that failed duplex has occurred. The error recovery program determines the cause of failed duplex, and if error recovery is successful, duplex mode is resumed. If the error recovery program is unable to perform error recovery successfully, then further write updates at the primary site are prohibited and an error message is communicated to operators at both the primary and secondary sites.

17 Claims, 14 Drawing Sheets

FIG. 9

| PHYSICAL CONTROL-LER ID | OPER-ATIONAL TIME STAMP | TIME INT GROUP # | READ RECORD SET TIME OF UPDATE / CONTROLLER | | |
|---|---|---|---|---|---|
| | | | SEQ. 1 OF 3 | SEQ. 2 OF 3 | SEQ. 3 OF 3 |
| SSID1 | $T_1$ | $G_1$ | 11:59 ② | 12:00 ⑤ | 12:01 ⑥ |
| SSID2 | $T_1$ | $G_1$ | 12:00 ④ | 12:02 ⑦ * | — |
| SSID3 | $T_1$ | $G_1$ | 11:58 ① | 11:59 ③ | 12:02 ⑧ * |
| SSID1 | $T_2$ | $G_2$ | | | |
| SSID2 | $T_2$ | $G_2$ | | | |
| SSID3 | $T_2$ | $G_2$ | | | |
| | $T_3$ | $G_3$ | | | |

CONSISTENCY GROUP #1

① 11:58
② 11:59
③ 11:59
④ 12:00
⑤ 12:00
⑥ 12:01

EARLIEST OPERATIONAL TIME $T_1$,
EARLIEST TIME OF UPDATE ACROSS SSID,
ORDERED IN READ SEQUENCE

MIN TIME OF THE MAX TIMES OF
UPDATE ACROSS ALL SSIDS

CONSISTENCY GROUP #2

⑦ -----
⑧ -----

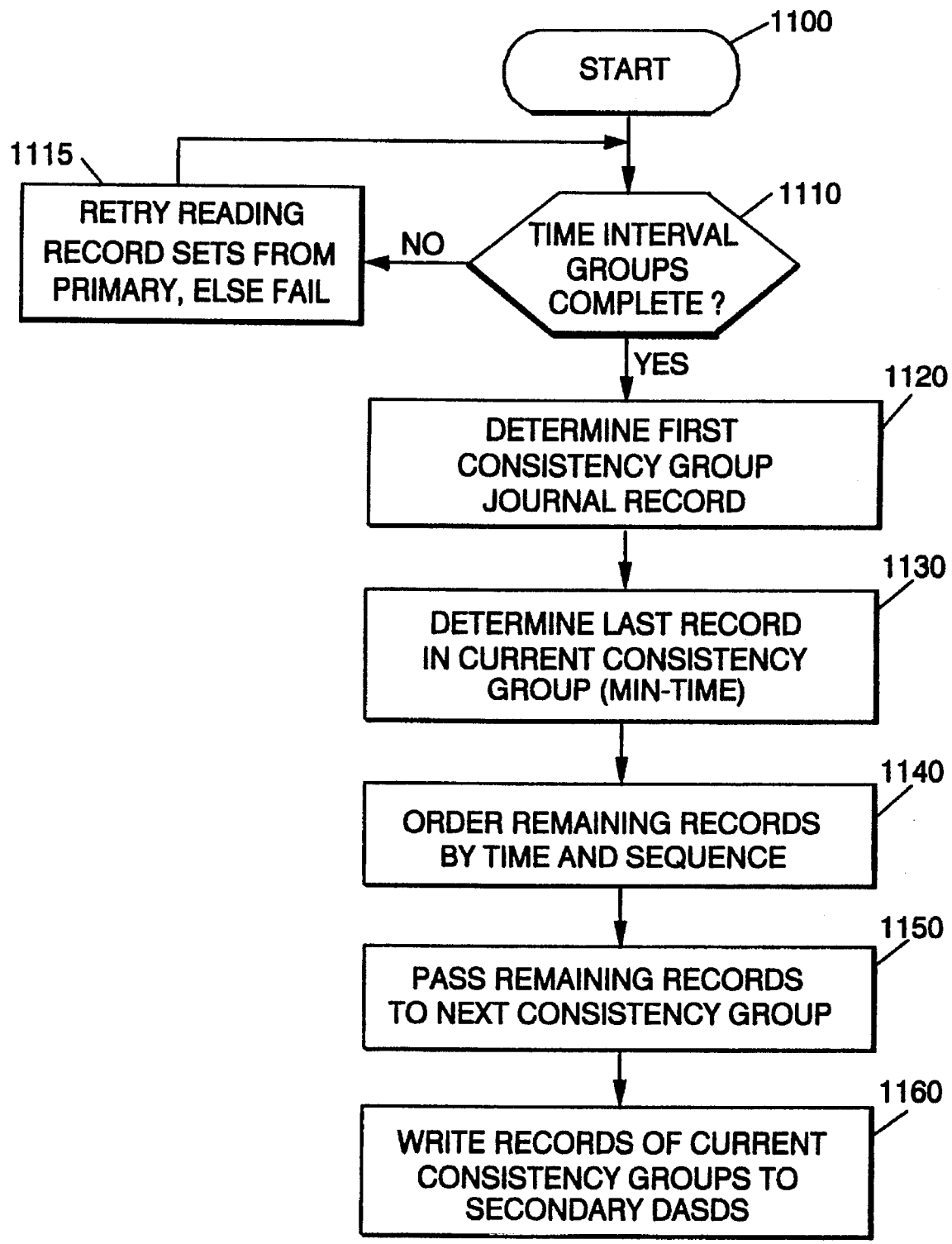

FIG. 12
FULL CONSISTENCY GROUP RECOVERY RULES

| READ RECORD SET BUFFER #2 | READ RECORD SET BUFFER #1 | | | | | | | |
|---|---|---|---|---|---|---|---|---|
| | TYPE I/O WRITE OPERATION | | | | | | | |
| | UPDATE WRITE KL = 0 | UPDATE WRITE KL ≠ 0 | FORMAT WRITE FULL | FORMAT WRITE PARTIAL | ERASE FULL | ERASE PARTIAL | WRITE ANY KL = 0 | WRITE ANY KL ≠ 0 |
| UPDATE WRITE KL = 0 | W* | E* | N | J | D | K | W | E* |
| UPDATE WRITE KL ≠ 0 | E* | W* | N | J | D | K | E* | W |
| FORMAT WRITE FULL | T | T | R | T | R | T | R | R |
| FORMAT WRITE PARTIAL | C | C | N | H | F | L | W | W |
| ERASE FULL | T | T | R | R | E | T | T | T |
| ERASE PARTIAL | B | B | N | M | E | G | W | W |
| WRITE ANY KL = 0 | W | E* | W | W | E | W | W | E* |
| WRITE ANY KL ≠ 0 | E* | W | W | W | E | W | E* | W |

FIG. 13

| FIG. 13A |
| FIG. 13B |

FIG. 13A

B - IF #1'S SEARCH ARG IS HIGHER THAN THE SEARCH ARG FOR #2, THEN THROW #1, ELSE DO BOTH.

C - IF #1'S RECORD IS EQUAL TO OR HIGHER THAN THE FIRST RECORD IN #2, THEN THROW #1, ELSE DO BOTH.

D - IF #2 IS UPDATING R0, THEN DO BOTH, ELSE ERROR.

E - ERROR (SHOULD NEVER HAPPEN).

E*- ERROR IF #1 AND #2 ARE THE SAME RECORD. (SHOULD NEVER HAPPEN WITHOUT A FORMAT WRITE IN BETWEEN).

F - IF FIRST RECORD IN #2 IS R1, THEN WRITE BOTH, ELSE ERROR.

G - IF #1'S SEARCH ARG IS EQUAL TO OR HIGHER THAN THE SEARCH ARG FOR #2, THEN THROW #1, ELSE ERROR.

H - IF #1'S SEARCH ARG IS HIGHER THAN THE LAST RECORD FOR #2. THEN THROW #1. ELSE IF #2'S SEARCH ARG IS HIGHER THAN THE LAST RECORD IN #1, THEN ERROR, ELSE WRITE BOTH.

---

TO OPTIMIZE FURTHER, CAN DO THE FOLLOWING INSTEAD:
   IF (1'S SEARCH IS EQUAL TO OR HIGHER THAN THE LAST RECORD
       IN #2) OR (THE LAST RECORD IN #1 IS EQUAL TO OR
       HIGHER THAN THE LAST RECORD IN #2) AND (2'S SEARCH
       IS LESS THAN OR EQUAL TO THE LAST RECORD IN #1)
   THEN THROW 1
   ELSE IF (#2'S SEARCH ARG IS HIGHER THAN THE LAST RECORD
       IN #1)
         THEN ERROR
         ELSE WRITE BOTH

J - IF #2'S RECORD (OR SEARCH) IS HIGHER THAN THE LAST RECORD IN #1, THEN ERROR, ELSE WRITE BOTH.

K - IF #2'S RECORD (OR SEARCH) IS HIGHER THAN #1'S SEARCH, THEN ERROR, ELSE WRITE BOTH.

L - IF #1'S SEARCH ARG IS EQUAL TO OR HIGHER THAN #2'S SEARCH ARG THEN EITHER WRITE BOTH OR OK TO THROW #1, ELSE ERROR.

M - IF (#1'S SEARCH ARG IS EQUAL TO OR HIGHER THAN #2'S SEARCH ARG) THEN THROW 1
　　ELSE IF (#2'S SEARCH ARG IS HIGHER THAN THE LAST RECORD IN #1)
　　　　THEN ERROR
　　　　　ELSE WRITE BOTH.

N - IF #2'S SEARCH ARG IS HIGHER THAN THE LAST RECORD IN #1, THEN ERROR, ELSE WRITE BOTH.

R - OK TO THROW #1.

T - MUST THROW 1.

W - WRITE BOTH.

W*- IF #1 AND #2 HAVE THE SAME RECORDS, THEN THROW #1, ELSE DO BOTH OR MERGE RECORDS AND DO ONE WRITE.

FIG. 13B

REMOTE DATA DUPLEXING

FIELD OF THE INVENTION

The present invention relates generally to disaster recovery techniques, and more particularly, to a system for real-time remote copying of direct access storage device (DASD) data.

BACKGROUND OF THE INVENTION

Data processing systems, in conjunction with processing data, typically are required to store large amounts of data (or records), which data can be efficiently accessed, modified, and re-stored. Data storage is typically separated into several different levels, or hierarchically, in order to provide efficient and cost effective data storage. A first, or highest level of data storage involves electronic memory, usually dynamic or static random access memory (DRAM or SRAM). Electronic memories take the form of semiconductor integrated circuits wherein millions of bytes of data can be stored on each circuit, with access to such bytes of data measured in nano-seconds. The electronic memory provides the fastest access to data since access is entirely electronic.

A second level of data storage usually involves direct access storage devices (DASD). DASD storage, for example, can comprise magnetic and/or optical disks, which store bits of data as micrometer sized magnetic or optical altered spots on a disk surface for representing the "ones" and "zeros" that make up those bits of the data. Magnetic DASD, includes one or more disks that are coated with remnant magnetic material. The disks are rotatably mounted within a protected environment. Each disk is divided into many concentric tracks, or closely spaced circles. The data is stored serially, bit by bit, along each track. An access mechanism, known as a head disk assembly (HDA), typically includes one or more read/write heads, and is provided in each DASD for moving across the tracks to transfer the data to and from the surface of the disks as the disks are rotated past the read/write heads. DASDs can store gigabytes of data with the access to such data typically measured in milli-seconds (orders of magnitudes slower than electronic memory). Access to data stored on DASD is slower due to the need to physically position the disk and HDA to the desired data storage location.

A third or lower level of data storage includes tape and/or tape and DASD libraries. At this storage level, access to data is much slower in a library since a robot is necessary to select and load the needed data storage medium. The advantage is reduced cost for very large data storage capabilities, for example, tera-bytes of data storage. Tape storage is often used for back-up purposes, that is, data stored at the second level of the hierarchy is reproduced for safe keeping on magnetic tape. Access to data stored on tape and/or in a library is presently on the order seconds.

Having a back-up data copy is mandatory for many businesses as data loss could be catastrophic to the business. The time required to recover data lost at the primary storage level is also an important recovery consideration. An improvement in speed over tape or library back-up, includes dual copy. An example of dual copy involves providing additional DASD's so that data is written to the additional DASDs (sometimes referred to as mirroring). Then if the primary DASDs fail, the secondary DASDs can be depended upon for data. A drawback to this approach is that the number of required DASDs is doubled.

Another data back-up alternative that overcomes the need to provide double the storage devices involves writing data to a redundant array of inexpensive devices (RAID) configuration. In this instance, the data is written such that the data is apportioned amongst many DASDs. If a single DASD fails, then the lost data can be recovered by using the remaining data and error correction procedures. Currently there are several different RAID configurations available.

The aforementioned back-up solutions are generally sufficient to recover data in the event that a storage device or medium fails. These back-up methods are useful only for device failures since the secondary data is a mirror of the primary data, that is, the secondary data has the same volume serial numbers (VOLSERs) and DASD addresses as the primary data. System failure recovery, on the other hand, is not available using mirrored secondary data. Hence still further protection is required for recovering data if a disaster occurs destroying the entire system or even the site, for example, earthquakes, fires, explosions, hurricanes, etc. Disaster recovery requires that the secondary copy of data be stored at a location remote from the primary data. A known method of providing disaster protection is to back-up data to tape, on a daily or weekly basis, etc. The tape is then picked up by a vehicle and taken to a secure storage area usually some kilo-meters away from the primary data location. A problem is presented in this back-up plan in that it could take days to retrieve the back-up data, and meanwhile several hours or even days of data could be lost, or worst, the storage location could be destroyed by the same disaster. A somewhat improved back-up method would be to transmit data to a back-up location each night. This allows the data to be stored at a more remote location. Again, some data may be lost between back-ups since back-up does not occur continuously, as in the dual copy solution. Hence, a substantial data amount could be lost which may be unacceptable to some users.

More recently introduced data disaster recovery solutions include remote dual copy wherein data is backed-up not only remotely, but also continuously. In order to communicate duplexed data from one host processor to another host processor, or from one storage controller to another storage controller, or some combination thereof, a substantial amount of control data is required for realizing the process. A high overhead, however, can interfere with a secondary site's ability to keep up with a primary site's processing, thus threatening the ability of the secondary site to be able to recover the primary in the event a disaster occurs.

Accordingly it is desired to provide a method and apparatus for providing a real time update of data consistent with the data at a primary processing location using minimal control data, wherein the method and apparatus operates independently of a particular application data being recovered, that is, generic storage media based rather than specific application data based.

SUMMARY OF THE INVENTION

An object of the present invention is to provide an improved design and method for shadowing write updates at a primary site to a secondary site.

According to a first embodiment of the present invention, a method for providing remote data shadowing includes a primary site having a primary processor coupled to a primary storage subsystem, wherein the primary processor runs at least one application causing I/O write updates to the primary storage subsystem. The primary processor further having an I/O error recovery program (I/O ERP) running therein. A secondary site includes a secondary processor coupled to a secondary storage subsystem, the secondary site synchronously shadowing the write updates and the secondary storage subsystem communicating with the I/O ERP. The method includes sending write updates from the primary storage subsystem to the secondary storage subsystem, and determining whether a duplex pair is established between the primary and secondary storage subsystems. A failed duplex pair is reported from the primary storage subsystem to the primary processor. The primary processor transfers control from the at least one application to the I/O ERP when failed duplex occurs, the I/O ERP determining a cause of the failed duplex, and sending a failed duplex message to the secondary storage subsystem.

In another embodiment of the present invention, a remote data duplexing system includes a primary site and a secondary site, wherein the secondary site receives write updates from the primary site for data back-up. The secondary site is located sufficiently remote from the primary site that in the event that a disaster occurs disabling the primary site, the secondary site can provide real time data availability. A primary processor at the primary site runs at least one application that causes write I/O updates, and a primary storage subsystem is connected thereto for receiving and storing the write I/O updates. A secondary processor is located at the secondary site and is coupled to the primary processor by a data link. A secondary storage subsystem, also at the secondary site, is coupled to the secondary processor and further coupled to the primary storage subsystem via communication links, the secondary storage subsystem providing a storage based duplex pair for back-up of the write I/O updates wherein the write I/O updates are written to the secondary storage subsystem in the order received. I/O and error recovery in the primary processor is coupled to the secondary storage subsystem for providing error recovery if a failed duplex occurs.

The foregoing and other objects, features, and advantages of the invention will be apparent from the following more particular description of a preferred embodiment of the invention, as illustrated in the accompanying drawing.

DESCRIPTION OF THE FIGURES

FIG. 9 is an example sequence for forming a consistency group, pursuant to an illustrative embodiment of the invention.

FIG. 11 is a flow diagram showing a method of forming consistency groups, in accordance with one embodiment of the invention.

FIG. 12 is a table indicating full consistency group recovery rules application for an ECKD architecture device for a given sequence of I/O operations to a DASD track, pursuant to an illustrative embodiment of the invention.

FIGS. 13, and 13B are is a description of the rules to be used in the table of FIG. 12, pursuant to an illustrative embodiment of the invention.

DETAILED DESCRIPTION

Figure 1:
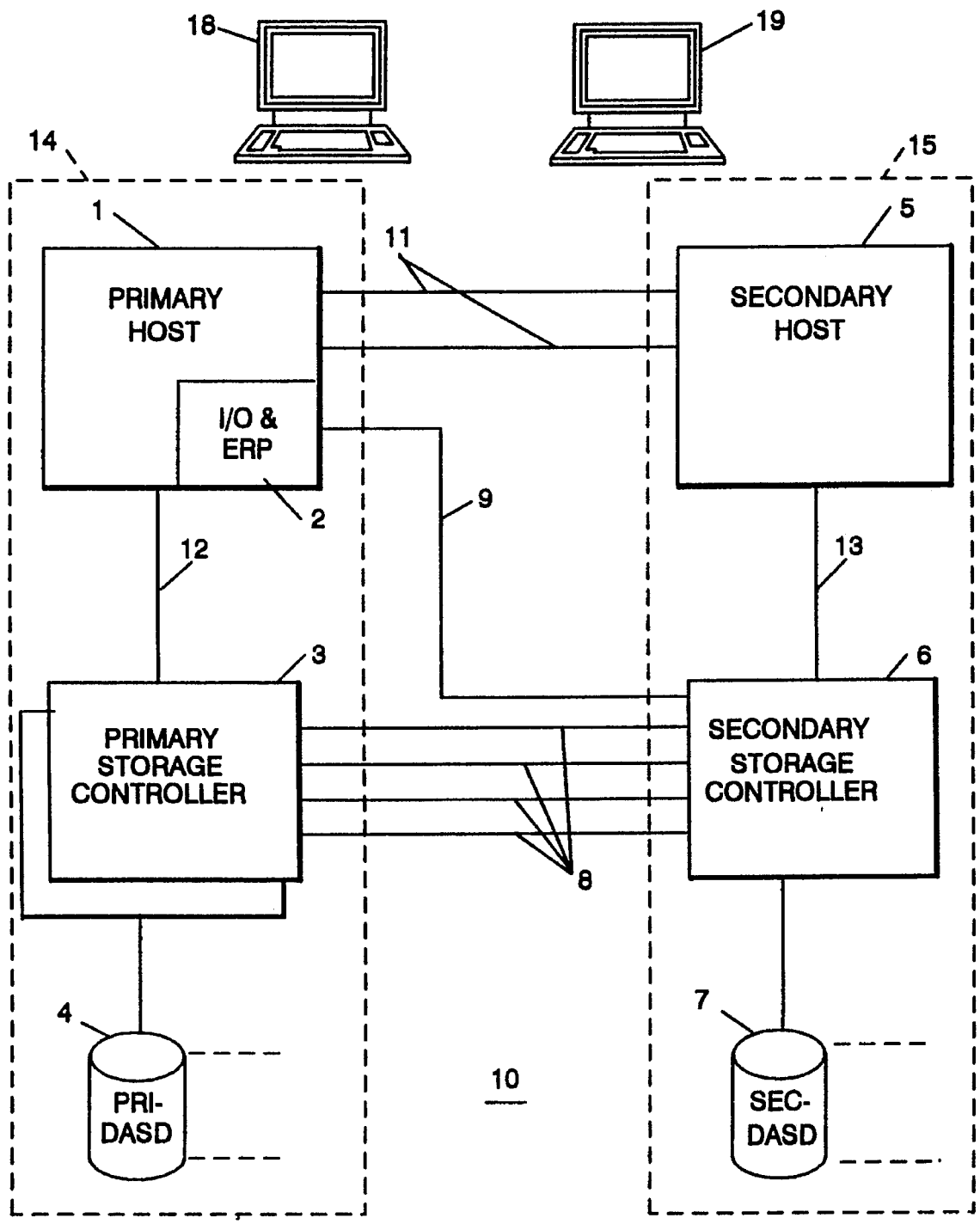
FIG. 1 is a block diagram of a disaster recovery system having synchronous remote data shadowing capabilities in accordance with one embodiment of the invention.

A typical data processing system may take the form of a host processor, such as an IBM System/360 or IBM System/370 processor for computing and manipulating data, and running, for example, data facility storage management subsystem/multiple virtual systems (DFSMS/MVS) software, having at least one IBM 3990 storage controller attached thereto, the storage controller comprising a memory controller and one or more cache memory types incorporated therein. The storage controller is further connected to a group of direct access storage devices (DASDs) such as IBM 3380 or 3390 DASDs. While the host processor provides substantial computing power, the storage controller provides the necessary functions to efficiently transfer, stage/destage, convert and generally access large databases.

Disaster recovery protection for the typical data processing system requires that primary data stored on primary DASDs be backed-up at a secondary or remote location. The distance separating the primary and secondary locations depends upon the level of risk acceptable to the user, and can vary from several kilo-meters to thousands of kilo-meters. The secondary or remote location, in addition to providing a back-up data copy, must also have enough system information to take over processing for the primary system should the primary system become disabled. This is due in part because a single storage controller does not write data to both primary and secondary DASD strings at the primary and secondary sites. Instead, the primary data is stored on a primary DASD string attached to a primary storage controller while the secondary data is stored on a secondary DASD string attached to a secondary storage controller.

The secondary site must not only be sufficiently remote from the primary site, but must also be able to back-up primary data in real time. The secondary site needs to back-up primary data as the primary data is updated with some minimal delay. Additionally, the secondary site has to back-up the primary data regardless of the application program (e.g., IMS, DB2) running at the primary site and generating the data and/or updates. A difficult task required of the secondary site is that the secondary data must be order consistent, that is, secondary data is copied in the same sequential order as the primary data (sequential consistency) which requires substantial systems considerations. Sequential consistency is complicated by the existence of multiple storage controllers each controlling multiple DASDs in a data processing system. Without sequential consistency, secondary data inconsistent with primary data would result, thus corrupting disaster recovery.

Remote data duplexing falls into two general categories, synchronous and asynchronous. Synchronous remote copy involves sending primary data to the secondary location and confirming the reception of such data before ending a primary DASD input/output (I/O) operation (providing a channel end (CE) and device end (DE) to the primary host). Synchronous copy, therefore, slows the primary DASD I/O response time while waiting for secondary confirmation. Primary I/O response delay is increased proportionately with the distance between the primary and secondary systems—a factor that limits the remote distance to tens of kilometers. Synchronous copy, however, provides sequentially consistent data at the secondary site with relatively little system overhead.

Asynchronous remote copy provides better primary application system performance because the primary DASD I/O operation is completed (providing a channel end (CE) and device end (DE) to the primary host) before data is confirmed at the secondary site. Therefore, the primary DASD I/O response time is not dependent upon the distance to the secondary site and the secondary site could be thousands of kilo-meters remote from the primary site. A greater amount of system overhead is required, however, for ensuring data sequence consistency since data received at the secondary site will often not be in order of the primary updates. A failure at the primary site could result in some data being lost that was in transit between the primary and secondary locations.

SYNCHRONOUS DATA SHADOWING

Synchronous real time remote copy for disaster recovery requires that copied DASD volumes form a set. Forming such a set further requires that a sufficient amount of system information be provided to the secondary site for identifying those volumes comprising each set and the primary site equivalents (VOLSERs). Importantly, the secondary site forms a "duplex pair" with the primary site and the secondary site must recognize when one or more volumes are out of sync with the set, that is, "failed duplex" has occurred. Connect failures are more visible in synchronous remote copy than in asynchronous remote copy because the primary DASD I/O is delayed while alternate paths are retried. The primary site can abort or suspend copy to allow the primary site to continue while updates for the secondary site are queued, the primary site marking such updates to show the secondary site is out of sync. Recognizing exception conditions that may cause the secondary site to fall out of sync with the primary site is needed in order that the secondary site be available at any time for disaster recovery. Error conditions and recovery actions must not make the secondary site inconsistent with the primary site.

Maintaining a connection between the secondary site and the primary site with secondary DASD present and accessible, however, does not ensure content synchronism. The secondary site may lose synchronism with the primary site for a number of reasons. The secondary site is initially out of sync when the duplex pair is being formed and reaches sync when an initial data copy is completed. The primary site may break the duplex pair if the primary site is unable to write updated data to the secondary site in which case the primary site writes updates to the primary DASD under suspended duplex pair conditions so that the updating application can continue. The primary site is thus running exposed, that is, without current disaster protection copy until the duplex pair is restored. Upon restoring the duplex pair, the secondary site is not immediately in sync. After applying now pending updates, the secondary site returns to sync. The primary site can also cause the secondary site to lose sync by issuing a suspend command for that volume to the primary DASD. The secondary site re-syncs with the primary site after the suspend command is ended, duplex pair is re-established, and pending updates are copied. On-line maintenance can also cause synchronization to be lost.

When a secondary volume is out of sync with a primary volume, the secondary volume is not useable for secondary system recovery and resumption of primary applications. An out-of-sync volume at the secondary site must be identified as such and secondary site recovery-takeover procedures need to identify the out-of-sync volumes for denying application access (forcing the volumes off-line or changing their VOLSERs). The secondary site may be called upon to recover the primary site at any instant wherein the primary site host is inaccessible—thus the secondary site requires all pertinent information about a sync state of all volumes. The secondary storage subsystem, that is the secondary storage controllers and DASD, is unable to determine all conditions causing the primary site to break synchronism due to primary site-encountered exceptions. For example, the primary site may break a duplex pair if the primary site is unable to access the secondary peer due to a primary I/O path or link failure that the secondary site is unaware of.

In this case the secondary site shows in-sync state while the primary site indicates the duplex pair is broken.

External communication may notify the secondary site that an out-of-sync duplex pair volume exists. This is realizable by employing a user systems management function. Primary I/O operations end with channel end/device end/unit check (CE/DE/UC) status and sense data indicates the nature of the error. With this form of I/O configuration an error recovery program (ERP) processes the error and send an appropriate message to the secondary processor before posting the primary application that I/O is complete. The user is then responsible to recognize the ERP suspend duplex pair message and secure that information at the secondary location. When the secondary site is depended upon to become operational in place of the primary site, a start-up procedure brings the secondary DASD on-line to the secondary host wherein sync status stored in the secondary DASD subsystem is retrieved for ensuring that out-of-sync volumes are not brought on-line for application allocation. This sync status merged with all ERP suspend duplex pair messages gives a complete picture of the secondary out-of-sync volumes.

Referring now to FIG. 1, a disaster recovery system 10 is shown having a primary site 14 and a secondary site 15, wherein the secondary site 15 is located, for example, 20 kilo-meters remote from the primary site 14. The primary site 14 includes a host processor or primary processor 1 having an application and system I/O and Error Recovery Program 2 running therein (hereinafter referred to as I/O ERP 2). The primary processor 1 could be, for example, an IBM Enterprise Systems/9000 (ES/9000) processor running DFSMS/MVS operating software and further may have several application programs running thereon. A primary storage controller 3, for example, an IBM 3990 Model 6 storage controller, is connected to the primary processor 1 via a channel 12. As is known in the art, several such primary storage controllers 3 can be connected to the primary processor 1, or alternately, several primary processors 1 can be attached to the primary storage controllers 3. A primary DASD 4, for example, an IBM 3390 DASD, is connected to the primary storage controller 3. Several primary DASDs 4 can be connected to the primary storage controller 3. The primary storage controller 3 and attached primary DASD 4 form a primary substorage system. Further, the primary storage controller 3 and the primary DASD 4 could be single integral units.

The secondary site 15 includes a secondary processor 5, for example, an IBM ES/9000, connected to a secondary storage controller 6, for example an IBM 3990 Model 3, via a channel 13. A DASD 7 is further connected to the secondary storage controller 6. The primary processor 1 is connected to the secondary processor 5 by at least one host-to-host communication link 11, for example, channel links or telephone T1/T3 line links, etc. The primary processor 1 may also have direct connectivity with the secondary storage controller 6 by, for example, multiple Enterprise Systems Connection (ESCON) links 9. As a result, the I/O ERP 2 can communicate, if required, with the secondary storage controller 6. The primary storage controller 3 communicates with the secondary storage controller 6 via multiple peer-to-peer links 8, for example, multiple ESCON links.

When a write I/O operation is executed by an application program running in the primary processor 1, a hardware status channel end/device end (CE/DE) is provided indicating the I/O operation completed successfully. Primary processor 1 operating system software marks the application write I/O successful upon successful completion of the I/O operation, thus permitting the application program to continue to a next write I/O operation which may be dependent upon the first or previous write I/O operation having successfully completed. On the other hand, if the write I/O operation was unsuccessful, the I/O status of channel end/device end/unit check (hereinafter referred to as CE/DE/UC) is presented to the primary processor 1 operating system software. Having presented unit check, the I/O ERP 2 takes control obtaining specific sense information from the primary storage controller 3 regarding the nature of the failed write I/O operation. If a unique error to a volume occurs then a unique status related to that error is provided to the I/O ERP 2. The I/O ERP 2 can thereafter perform new peer-to-peer synchronization error recovery for maintaining data integrity between the primary storage controller 3 and the secondary storage controller 6, or in the worst case, between the primary processor 1 and the secondary processor 5.

Figure 2:
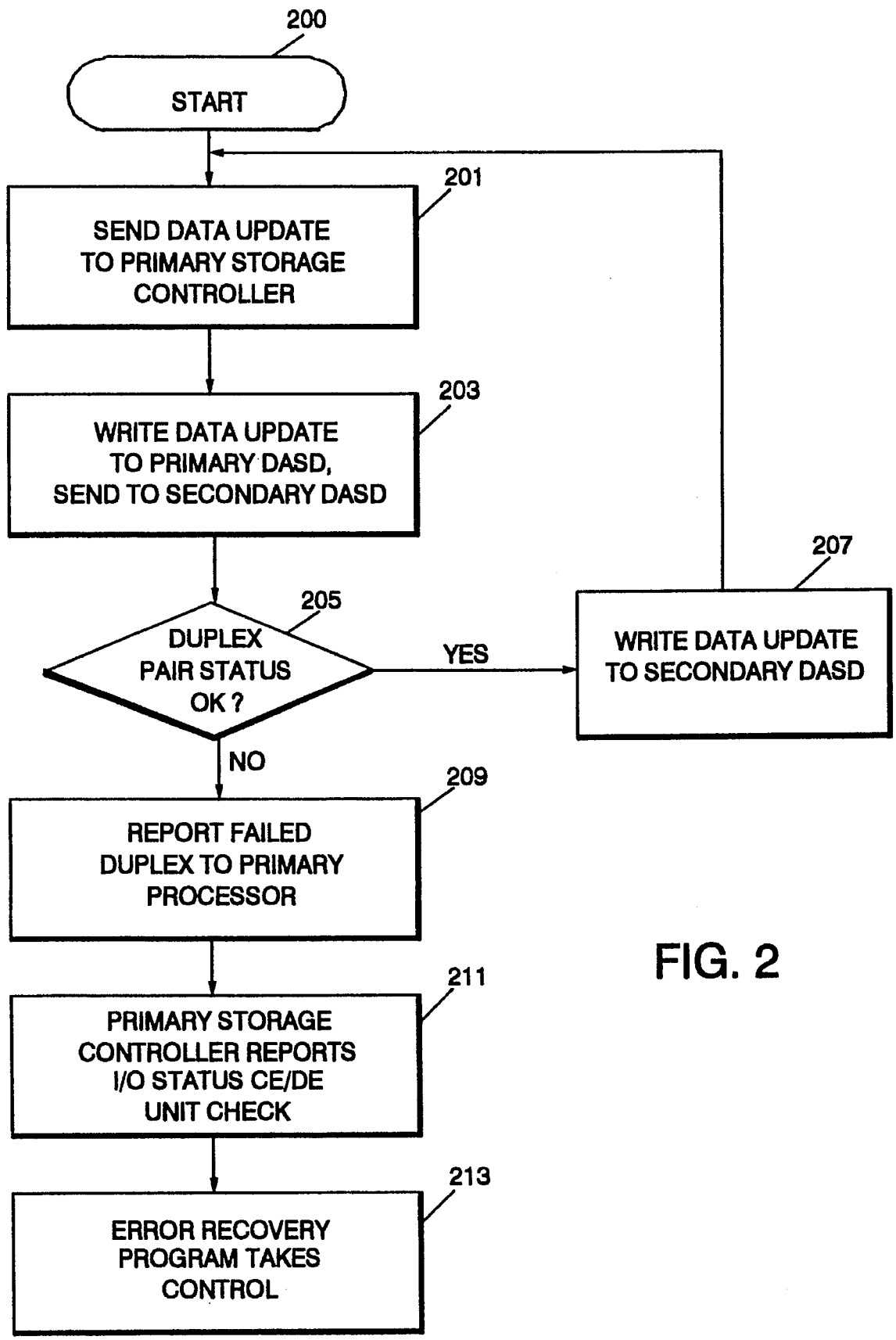
FIG. 2 is a flow diagram of a method for providing synchronous remote copy in the disaster recovery system of FIG. 1 in accordance with one embodiment of the invention.
Figure 3:
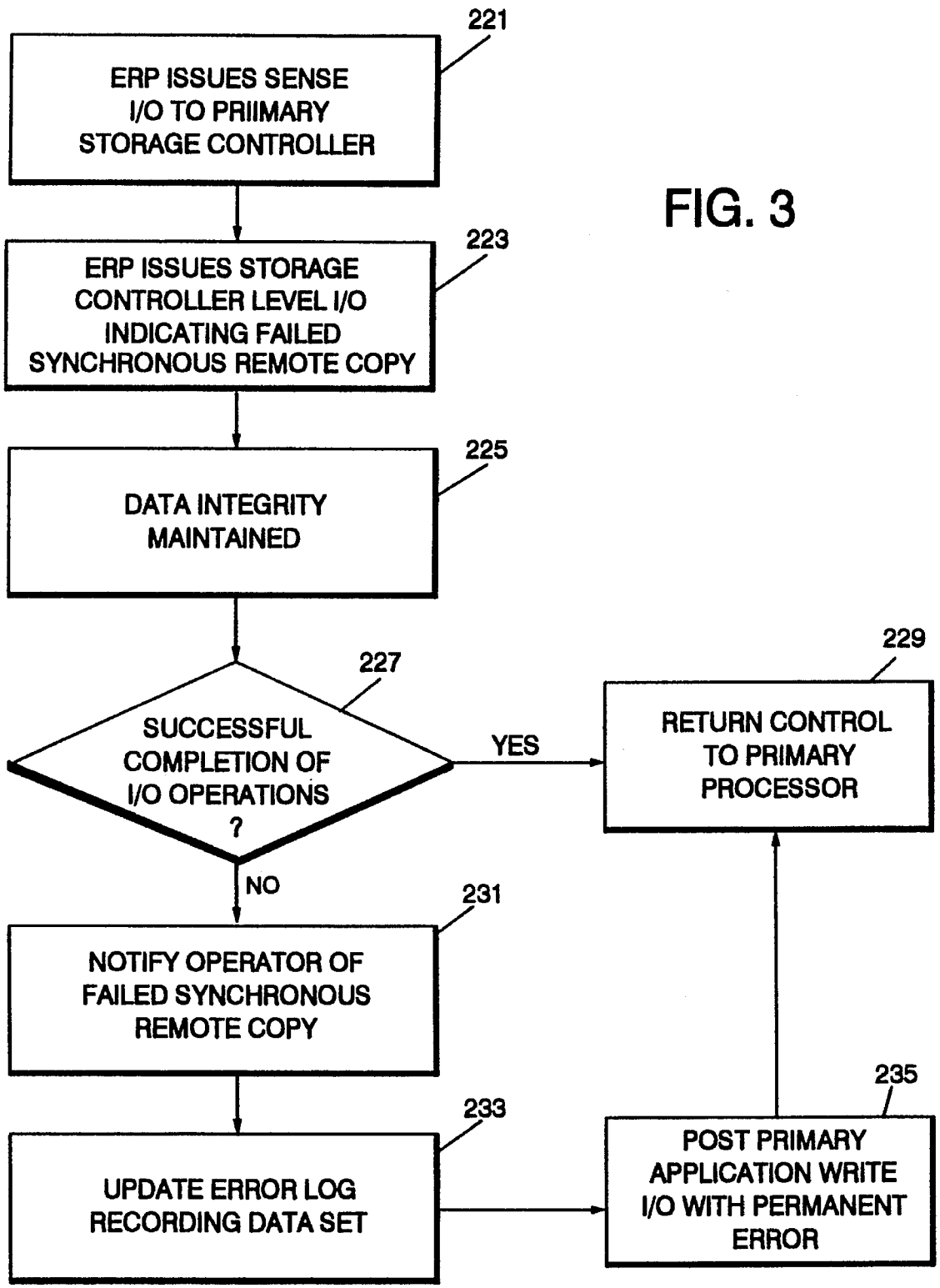
FIG. 3 is a flow diagram of a method of an I/O error recovery program (I/O ERP) operation, in accordance with one embodiment of the invention.

Referring to FIGS. 2 and 3, the error recovery procedure is set forth. In FIG. 2, a step 201 includes an application program running in the primary processor 1 sending a data update to the primary storage controller 3. At step 203 the data update is written to the primary DASD 4, and the data update is shadowed to the secondary storage controller 6. At step 205 the duplex pair status is checked to determine whether the primary and secondary sites are synchronized. If the duplex pair status is in a synchronized state, then the data update is written to the secondary DASD 7 at step 207 while processing then continues at the primary processor 1 via application programs running thereat.

In the case that the duplex pair is in a "failed" state, then at step 209 the primary storage controller 3 notifies the primary processor 1 that duplex pair has suspended or failed. The duplex pair can become "failed" due to communication failure between the primary storage controller 3 and the secondary storage controller 6 via communication links 8. Alternatively, duplex pair can become "failed" due to errors in either the primary or secondary subsystem. If the failure is in the communication links 8, then the primary storage controller 3 is unable to communicate the failure directly to the secondary storage controller 6. At step 211 the primary storage controller 3 returns I/O status CE/DE/UC to the primary processor 1. The I/O ERP 2 quiesces the application programs hence taking control of the primary processor 1 at step 213 for error recovery and data integrity before returning control to the application requesting the write I/O operation.

FIG. 3 represents steps performed by the I/O ERP 2. The I/O ERP 2 issues a sense I/O to the primary storage controller 3 at step 221. The sense I/O operation returns information describing the cause of the I/O error, that is, the data description information is unique to the storage controllers or duplex pair operation regarding specific errors. In the event that the data description information indicates that the peer-to-peer communication links 8 have failed between the primary storage controller 1 and the secondary storage controller 6, then at step 223 the I/O ERP 2 issues a storage controller level I/O operation against the primary storage controller 3 and the secondary storage controller 6 indicating that the affected volume is to be placed in failed synchronous remote copy state. This secondary storage controller 6 is able to receive the state of the affected volume from the I/O ERP 2 via the multiple ESCON links 9 or the host-to-host communication link 11. Consequently, the current status of the duplex pair operation is maintained at both the primary processor 1 and the secondary processor 5 in conjunction with applications running in the primary processor 1. Consoles 18 and 19 are provided for communicating information from the primary processor 1 and secondary processor 4, respectively, wherein the I/O ERP posts status information to both consoles 18 and 19.

Data integrity has been maintained at step 225 upon successful completion of the failed synchronous remote copy I/O operation to the primary storage controller 3 and the secondary storage controller 6. Therefore, if a recovery is attempted at the secondary site 15 the secondary storage controller 6 identifies the volume marked "failed synchronous remote copy" as not being useable until data on that volume are synchronized with other data in that synchronization group by data recovery means (conventional data base logs and/or journals for determining the state of that data on the volume).

Step 227 tests to determine whether the I/O ERP 2 received successful completion of the I/O operations at the primary storage controller 3 and the secondary storage controller 6 on the failed synchronous remote copy status update. Upon successful completion, the I/O ERP 2 returns control to the Primary processor 1 at step 229. Otherwise step 231 performs a next level recovery notification which involves notifying an operator, via the console 18, of the failed volume and that a status of that volume at either the primary storage controller 3 or the secondary storage controller 6 may not be correct. The notification is shadowed to the secondary site 15, via the console 19 or a shared DASD data set, for indicating the specific volume status there.

An error log recording data set is updated at step 233. This update is written to either the primary DASD 4 or some other storage location and is shadowed to the secondary site 15. Having completed the error recovery actions, the I/O ERP 2, at step 235, posts to the primary application write I/O operation a "permanent error" for causing the primary application an error normal "permanent error" recovery for the failed write I/O operation. Once the error is corrected, the volume states can be recovered, first to pending (recopy changed data) and then back to full duplex. The data may later be re-applied to the secondary DASD 7 once duplex pair is re-established.

When establishing a duplex pair a volume can be identified as CRITICAL according to a customer's needs. For a CRITICAL volume, when an operation results in failing a duplex pair, a permanent error failure of the primary volume is reported irrespective of the actual error's location. With CRIT=Y, all subsequent attempts to write to the primary DASD 405 of the failed pair will receive a permanent error, ensuring that no data is written to that primary volume that cannot also be shadowed to the paired secondary volume. This permits complete synchronization with the primary application actions and the I/O data operations when required.

Consequently, the disaster recovery system 10 described herein, introduces outboard synchronous remote copy such that a primary host process error recovery procedure having an I/O order (channel command word (CCW)) may change a status of a primary and secondary synchronous remote copy volume from duplex pair to failed duplex thereby maintaining data integrity for several types of primary and secondary subsystem errors. Storage based back-up, rather than application based back-up, wherein data updates are duplicated in real time has been provided. The disaster recovery system 10 also attempts several levels of primary/ secondary status updates, including: (1) primary and secondary storage controller volume status updates; (2) primary and secondary host processor notification on specific volume update status via operator messages or error log recording common data sets; and (3) CRITICAL volume indication, future updates to the primary volume can be prevented if the volume pair goes failed duplex. Hence, real time, full error disaster recovery is accomplished.

ASYNCHRONOUS DATA SHADOWING

Asynchronous remote data shadowing is used when it is necessary to further increase a distance between primary and secondary sites for reducing the probability that a single disaster will corrupt both primary and secondary sites, or when primary application performance impact needs to be minimized. While the distance between primary and secondary sites can now stretch across the earth or beyond, the synchronization of write updates across multiple DASD volumes behind multiple primary subsystems to multiple secondary subsystems is substantially more complicated. Record write updates can be shipped from a primary storage controller via a primary data mover to a secondary data mover for shadowing on a secondary storage subsystem, but the amount of control data passed therebetween must be minimized while still being able to re-construct an exact order of the record write updates on the secondary system across several storage controllers as occurred on the primary system across multiple DASD volumes behind several storage controllers.

Figure 4:
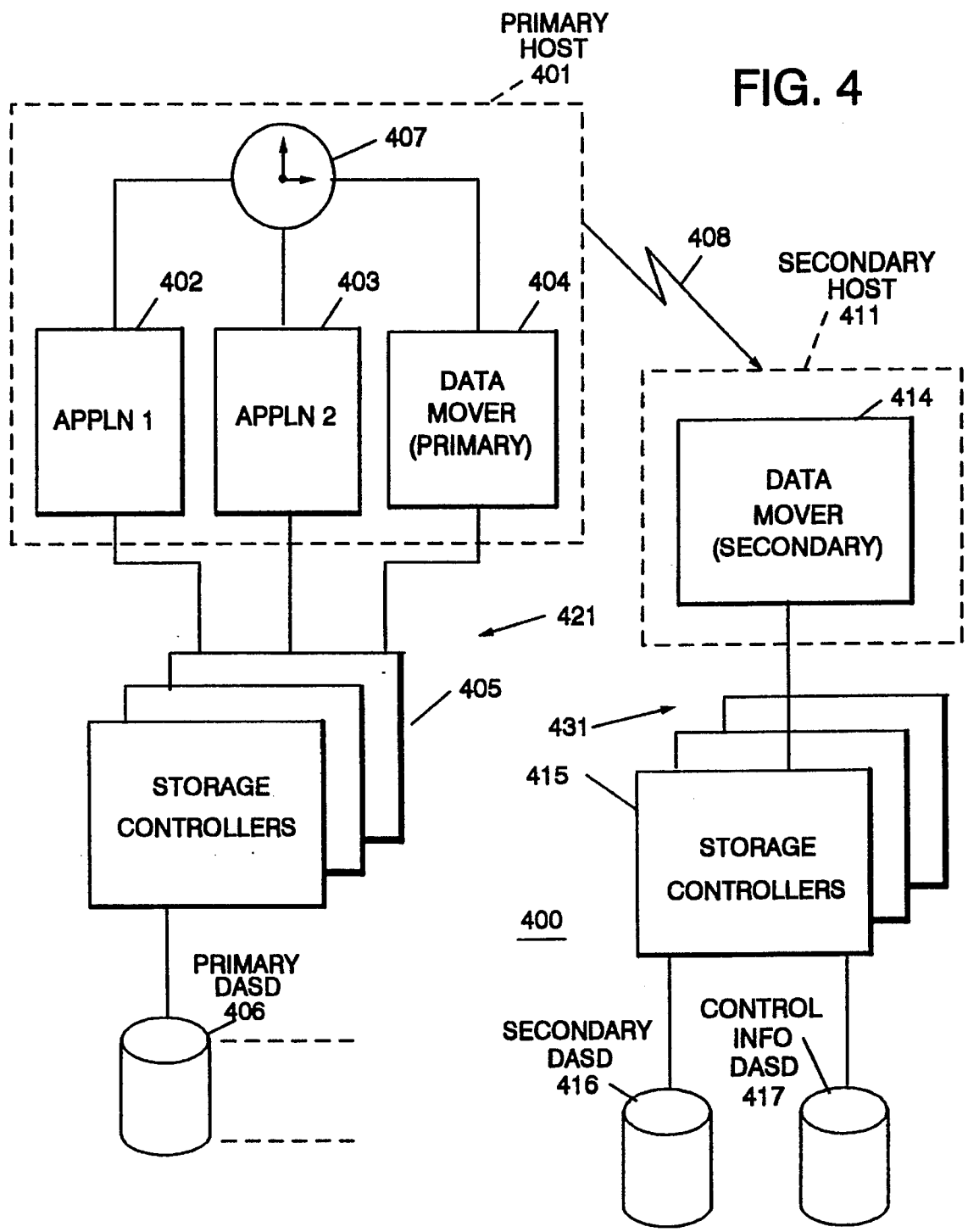
FIG. 4 is a block diagram of a disaster recovery system having asynchronous remote data shadowing capabilities in accordance with one embodiment of the invention.

FIG. 4 depicts an asynchronous disaster recovery system 400 including a primary site 421 and a remote or secondary site 431. The primary site 421 includes a primary processor 401, for example, an IBM ES/9000 running DFSMS/MVS host software. The primary processor 401 further includes application programs 402 and 403, for example, IMS and DB2 applications, and a primary data mover (PDM) 404. A common sysplex clock 407 is included in the primary processor 401 for providing a common reference to all applications (402, 403) running therein, wherein all system clocks or time sources (not shown) synchronize to the sysplex clock 407 ensuring all time dependent processes are properly timed relative to one another. The primary storage controllers 406, for example, synchronize to a resolution appropriate to ensure differentiation between record write update times, such that no two consecutive write I/O operations to a single primary storage controller 404 can exhibit the same time stamp value. The resolution, and not the accuracy, of the sysplex timer 407 is critical. The PDM 404, though shown connected to the sysplex timer 407, is not required to synchronize to the sysplex timer 407 since write I/O operations are not generated therein. A sysplex timer 407 is not required if the primary processor 401 has a single time reference (for example, a single multi-processor ES/9000 system).

A plurality of primary storage controllers 405, for example, IBM 3990 Model 6 storage controllers, are connected to the primary processor 401 via a plurality of channels, for example, fiber optic channels. Connected to each primary storage controller 405 is at least one string of primary DASDs 406, for example, IBM 3390 DASDs. The primary storage controllers 405 and the primary DASDs 406 form a primary storage subsystem. Each storage controller 405 and primary DASD 406 need not be separate units, but may be combined into a single drawer.

The secondary site 431, located for example, some thousands of kilo-meters remote from the primary site 421, similar to the primary site 421, includes a secondary processor 411 having a secondary data mover (SDM) 414 operating therein. A plurality of secondary storage controllers 415 are connected to the secondary processor 411 via channels, for example, fiber optic channels, as is known in the art. Connected to the storage controllers 415 are a plurality of secondary DASDs 416 and a control information DASD(s) 417. The storage controllers 415 and DASDs 416 and 417 comprise a secondary storage subsystem.

The primary site 421 communicates with the secondary site 431 via a communication link 408. More specifically, the primary processor 401 transfers data and control information to the secondary processor 411 by a communications protocol, for example, a virtual telecommunications access method (VTAM) communication link 408. The communication link 408 can be realized by several suitable communication methods, including telephone (T1, T3 lines), radio, radio/telephone, microwave, satellite, etc.

The asynchronous data shadowing system 400 encompasses collecting control data from the primary storage controllers 405 so that an order of all data writes to the primary DASDs 406 is preserved and applied to the secondary DASDs 416 (preserving the data write order across all primary storage subsystem). The data and control information transmitted to the secondary site 431, must be sufficient such that the presence of the primary site 421 is no longer required to preserve data integrity.

The applications 402, 403 generate data or record updates, which record updates are collected by the primary storage controllers 405 and read by the PDM 404. The primary storage controllers 405 each grouped its respective record updates for an asynchronous remote data shadowing session and provides those record updates to the PDM 404 via non-specific primary DASD 406 READ requests. Transferring record updates from the primary storage controllers 405 to the PDM 404 is controlled and optimized by the PDM 404 for minimizing a number of START I/O operations yet maximizing an amount of data transferred between each primary storage controller 405 and the primary processor 401. The PDM 404 can vary a time interval between non-specific READs to control this primary storage controller-host optimization as well as a currency of the record updates for the secondary DASDs 416.

Collecting record updates by the PDM 404, and transmitting those record updates to the SDM 414, while maintaining data integrity, requires the record updates to be transmitted for specific time intervals and in appropriate multiple time intervals with enough control data to reconstruct the primary DASDs 406 record WRITE sequence across all primary storage subsystems to the secondary DASDs 416. Reconstructing the primary DASDs 406 record WRITE sequences is accomplished by passing self describing records from the PDM 404 to the SDM 414. The SDM 414 inspects the self describing records for determining whether any records for a given time interval have been lost or are incomplete.

Figure 5:
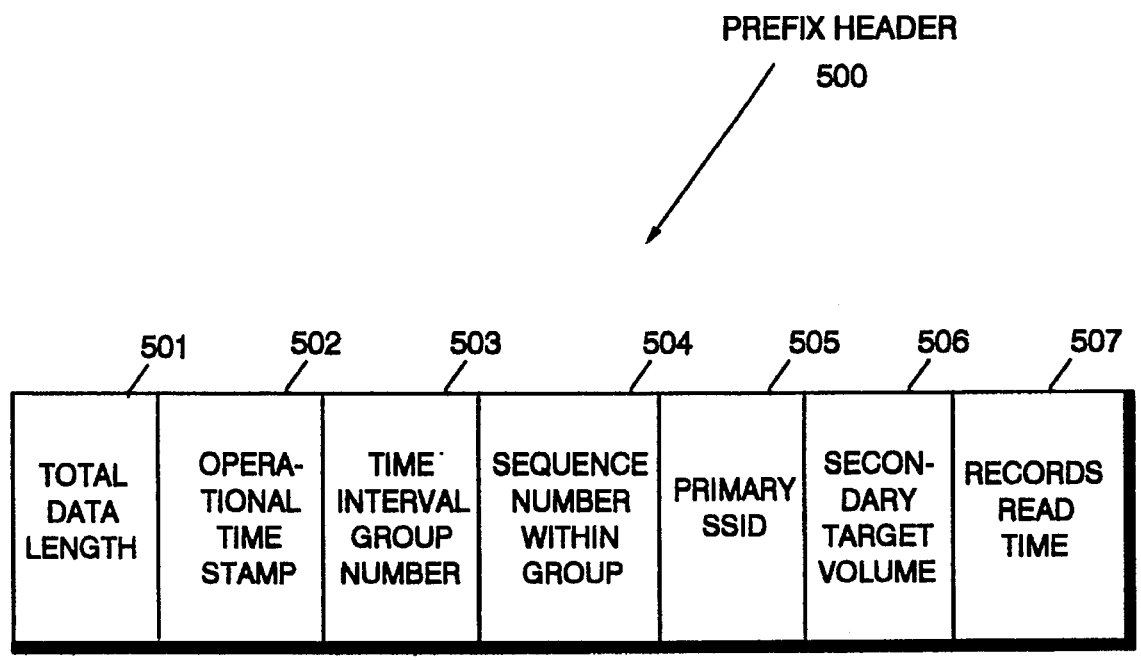
FIG. 5 is a data format diagram showing a prefix header that prefixes read record sets from the primary site of FIG. 4, pursuant to an illustrative embodiment of the invention.
Figure 6:
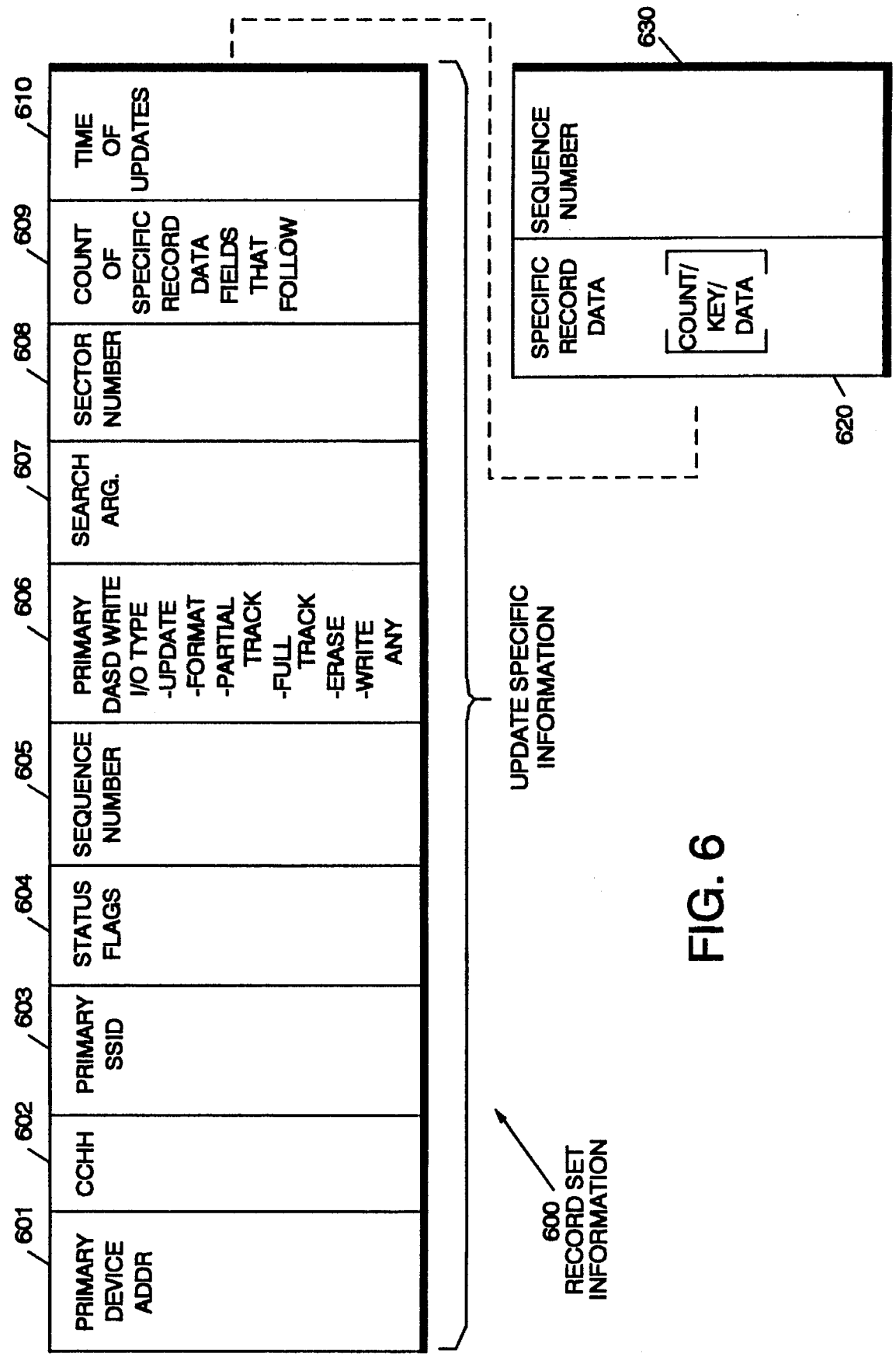
FIG. 6 is a data format diagram describing fields making up a read record set, pursuant to an illustrative embodiment of the invention.

FIGS. 5 and 6 show a journal record format created by the PDM 404 for each self describing record, including a prefix header 500 (FIG. 5), and a record set information 600 (FIG. 6) as generated by the primary storage controller 405. Each self describing record is further journaled by the SDM 414 for each time interval so that each self describing record can be applied in time sequence for each time interval to the secondary DASDs 416.

Referring now to FIG. 5, the prefix header 500, which is inserted at the front of each record set, includes a total data length 501 for describing the total length of the prefix header 500 and actual primary record set information 600 that is transmitted to the SDM 414 for each record set.

An operational time stamp 502 is a time stamp indicating a start time for the operational set that the PDM 404 is currently processing. The operational time stamp 502 is generated by the PDM 404 (according to the sysplex timer 407) when performing a READ RECORD SET function to a set of the primary storage controllers 405. An I/O time 610 (FIG. 6) of the primary DASDs 406 write is unique for each primary storage controller 405 READ RECORD SET. The operational time stamp 502 is common across all storage controllers. A READ RECORD SET command is issued by the PDM 404 and can be predicated upon one of the following conditions:

(1) Primary storage controller 405 attention interrupt based upon that primary storage controller predetermined threshold;

(2) Primary processor 401 timer interrupt based upon a predetermined time interval; or (3) Record set information indicates additional information on outstanding record sets available but not yet read.

Condition (2) uses a timer interval to control how far behind the secondary system 431 executes during periods of low activity. Condition (3) occurs when the PDM 404 fails to drain all record sets during a processing interval which drives further activity for ensuring that the PDM 404 keeps up with primary storage controller 405 activity.

A time interval group number 503 is supplied by the PDM 404 to identify a time interval (bounded by operational time stamp 502 and a records read time 507) for which the current record sets belong (sets of records across all primary storage controllers 405 for a given time interval group form consistency groups). A sequence number within group 504 is a hardware provided identification (to the PDM 404) of a sequence of application WRITE I/Os for primary storage controller 405 for each record set within a given time interval group 503. A primary SSID (substorage identification) 505 uniquely identifies the specific primary storage controller of the primary storage controllers 405 for each record set. A secondary target volume 506 is assigned by either the PDM 404 or the SDM 414 depending upon performance considerations. A records read time 507 supplies an operational time stamp that is common to all primary storage controllers 405 indicating an end time for the record set of the current interval.

Referring now to FIG. 6, the record set information 600 is generated by the primary storage controllers 405 and collected by the PDM 404. Update Specific Information 601–610, includes a primary device unit address 601 of each record indicating the actual primary DASD 406 that the record update occurred on. A cylinder number/head number (CCHH) 602 indicates a location on primary DASD 406 for each record update. Primary SSID 603, the primary storage controller session identifier is the same as primary SSID 505. Status flags 604 provide status information regarding whether specific data records 620 follow. Sequence numbers 605 and 630 assign a number to each record for indicating whether the entire record set has been read (all data transferred to the PDM 404). Primary DASD write I/O type 606 is an operation indicator identifying the type of write operation performed on each record, the operation indicators including: update write; format write; partial track records follow; full track data follows; erase command performed; or write any performed. Search argument 607 indicates initial positioning information for the first read record set data record 620. A sector number 608 identifies that sector that the record was updated at. Count field 609 describes a number of specific record data fields 620 that follow. A host application time when the primary DASD 406 write update occurred is recorded in time of updates 610. Specific record data 620 provides a count/key/data (CKD) field of each record update. Lastly, the sequence number 630 is compared to the sequence number 605 for indicating whether the entire read record set was transferred to the PDM 404.

The update records are handled in software groups called consistency groups so that the SDM 414 can copy the record updates in the same order they were written at the primary DASDs 406. The information used for creating the consistency groups (across all record sets collected from all storage controllers 405) includes the: operational time stamp 502; time interval group number 503; sequence number within group 504; primary controller SSID 505; records read time 507; primary device address 601; the primary SSID 603; and the status flags 604. The information used for determining whether all records for a time interval group have been received for each storage controller 405 at the SDM 414 includes the: time interval group number 503; sequence number within group 504; physical controller ID 505; and the primary SSID 603. The information necessary to place record updates on the secondary DASDs 416 equivalently to the primary DASDs 406 record updates with full recover possible includes the: secondary target volume 506; CCHH 602; primary DASD write I/O type 606; search argument 607; sector number 608; count 609; time of updates 610; and the specific record data 620.

Figure 7:
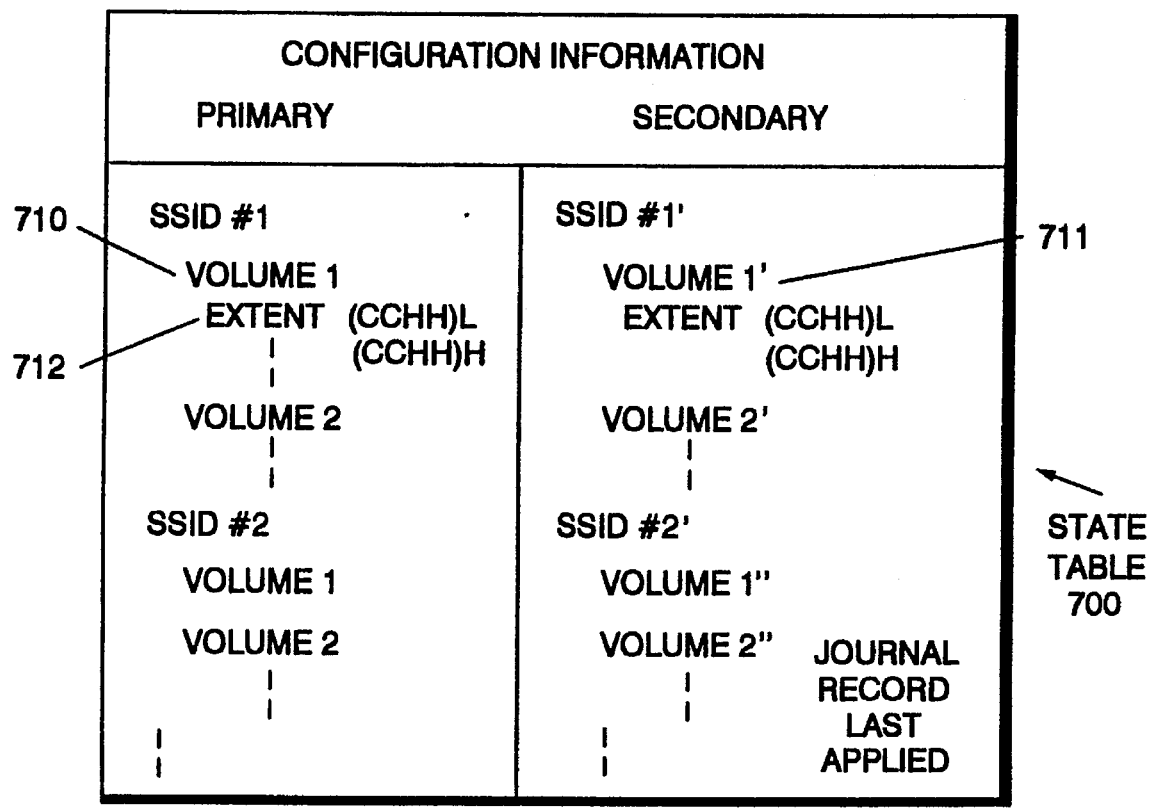
FIG. 7 is a state table identifying volume configuration information, pursuant to an illustrative embodiment of the invention.
Figure 8:
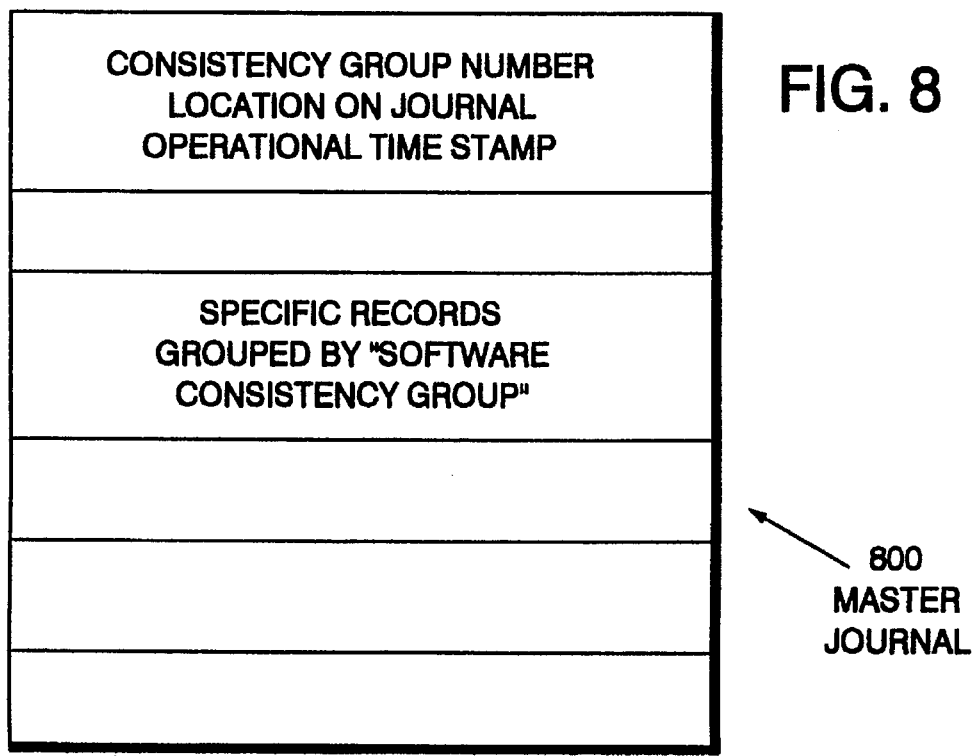
FIG. 8 is a master journal as used by the secondary site of FIG. 4, pursuant to an illustrative embodiment of the invention.

FIGS. 7 and 8 show a state table 700 and a master journal 800, respectively, for describing a current journal contents, which simplifies recovery time and journal transfer time. The state table 700 provides configuration information, collected by the either the PDM 404 or SDM 414, and includes primary storage controller session identifiers (SSID numbers) and the volumes therein, and the corresponding secondary storage controller session identifiers and the corresponding volumes. Thus the configuration information tracks which primary volumes 710 or primary DASD extents map to secondary volumes 711 or secondary DASD extents. With a simple extension to the state table 700 indicating partial volume extents 712 (CCHH to CCHH), partial volume remote copy can be accomplished using the same asynchronous remote copy methods described herein, but for a finer granularity (track or extent) than full volume.

The master journal 800 includes: consistency group number; location on journal volumes; and operational time stamp. The master journal 800 further maintains specific record updates as grouped in consistency groups. The state table 700 and master journal 800 support disaster recovery, and hence must be able to operate in a stand-alone environment wherein the primary system 401 no longer exists.

A time stamp control is placed at the front and back of each master journal 800 to ensure that the entire control entry was successfully written. The time stamp control is further written to the secondary DASDs 417. The control elements include dual entries (1) and (2), wherein one entry is always a current entry, for example:

(1) Timestamp control|Control Info|Timestamp Control (2) Timestamp Control|Control Info|Timestamp Control.

At any point in time either entry (1) or (2) is the current or valid entry, wherein a valid entry is that entry with equal timestamp controls at the front and back. Disaster recovery uses the valid entry with the latest timestamp to obtain control information. This control information, along with state information (environmental information regarding storage controllers, devices, and applied consistency groups), is used for determining what record updates have been applied to the secondary storage controllers 415.

CONSISTENCY GROUPS

After all read record sets across all primary storage controllers 405 for a predetermined time interval are received at the secondary site 431, the SDM 414 interprets the received control information and applies the received read record sets to the secondary DASDs 416 in groups of record updates such that the record updates are applied in the same sequence that those record updates were originally written on the primary DASDs 406. Thus, all primary application order (data integrity) consistency is maintained at the secondary site 431. This process is hereinafter referred to as forming consistency groups. Forming consistency groups is based on the following assumptions: (A) application writes that are independent can be performed in any order if they do not violate controller sequence order; (B) application writes that are dependent must be performed in timestamp order, hence an application cannot perform a dependent write number two before receiving control unit end, device end from write number one; and (C) a second write will always be either (1) in a same record set consistency group as a first write with a later timestamp or (2) in a subsequent record set consistency group.

Referring to FIG. 9, an example of forming a consistency group (the consistency group could be formed at either the primary site 421 or secondary site 431), for example, for storage controllers SSID 1, SSID 2, and SSID 3 is shown (any number of storage controllers can be included but three are used in this example for clarity). Time intervals T1, T2 and T3 are assumed to occur in ascending order. An operational time stamp 502 of time interval T1 is established for storage controllers SSID 1, SSID 2 and SSID 3. The PDM 404 obtains record set data from storage controller SSIDs 1, 2, and 3 for time interval T1–T3. The record sets for SSIDs 1, 2, and 3 for time interval T1 are assigned to time interval group 1, G1 (time interval group number 503). The sequence number within group 504 is shown for each SSID 1, 2, and 3, wherein SSID has three updates as 11:59, 12:00, and 12:01, SSID 2 has two updates at 12:00 and 12:02, and SSID 3 has three updates at 11:58, 11:59, and 12:02. Record sets of time intervals T2 and T3 are listed but example times of updates are not given for simplicity.

Consistency group N can now be formed based upon the control information and record updates received at the secondary site 431. In order to ensure that no record update in time interval group number one is later than any record update of time interval group number two, a min-time is established which is equal to a the earliest read record set time of the last record updates for each storage controller SSID 1, 2, and 3. In this example then, min-time is equal to 12:01. Any record updates having a read record set time greater than or equal to min-time is included in the consistency group N+1. If two record update times to a same volume were equal, though unlikely given sufficient resolution of the sysplex timer 407, the record update having the earlier sequence number within the time interval group N is kept with that group for consistency group N. The record updates are now ordered based upon read record set times. Record updates having equal times will cause the record update having the lower sequence number to be place before the later sequence numbered record update. Alternatively, record updates having equal time stamps, but to differing volumes, may be ordered arbitrarily as long as they are kept in the same consistency group.

If a primary storage controller 405 fails to complete a response to a read record set during a specified time interval, then a consistency group cannot be formed until that primary storage controller 405 completes. In the event that the primary storage controller 405 fails to complete its operation, then a missing interrupt results causing a system missing interrupt handler to receive control and the operation will be terminated. On the other hand, if the primary storage controller 405 timely completes the operation then the I/O will be driven to completion and normal operation will continue. Consistency group formation expects that write operations against the primary storage controllers 405 will have time stamps. Some programs, however, will cause writes to be generated without time stamps, in which case the primary storage controller 405 will return zeros for the time stamp. Consistency group formation can bound those records without time stamps based upon the timestamp that the data was read. If too many record updates without time stamps occur over a time interval such that the record updates are not easily bounded by consistency group times, then an error that the duplex volumes are out of synchronization may result.

Figure 10:
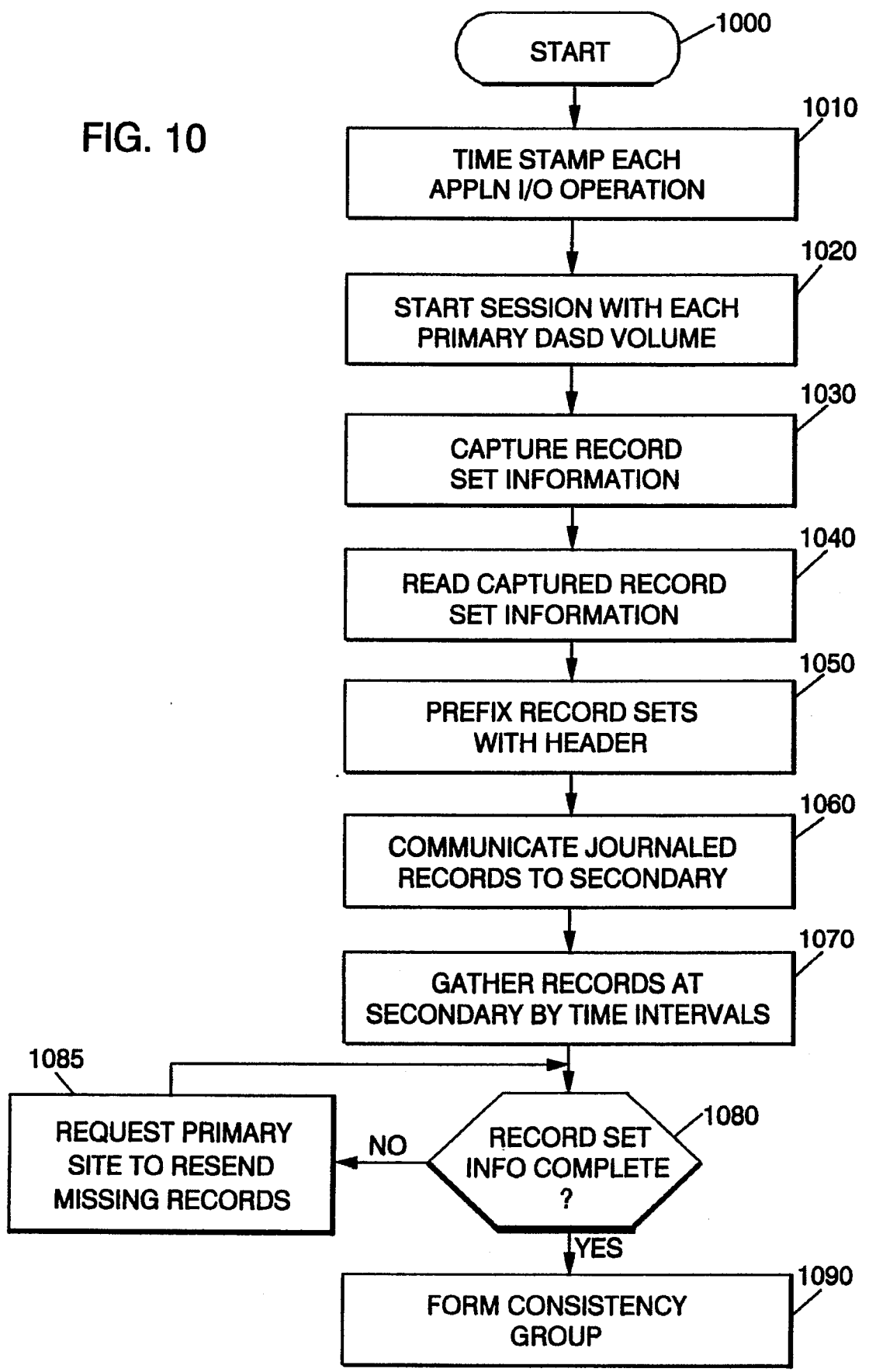
FIG. 10 is a flow diagram showing a method of collecting information and read record sets for forming consistency groups, in accordance with one embodiment of the invention.

FIGS. 10 and 11 are flow diagrams presenting the method of forming consistency groups. Referring to FIG. 10, the process starts at step 1000 with the primary site 421 establishing remote data shadowing to occur. At step 1010 all application I/O operations are time stamped using the sysplex timer 407 as a synchronization clock (FIG. 4). The PDM 404 starts a remote data shadowing session with each primary storage controller 405 at step 1020 which includes identifying those primary volumes that will have data or records shadowed. Record set information 600 is trapped by the primary storage controllers 405 for each application WRITE I/O operation (see FIG. 6) by step 1030.

Step 1040 involves the PDM 404 reading the captured record set information 600 from each primary storage controller 405 according to a prompt including an attention message, a predetermined timing interval, or a notification of more records to read as described earlier. When the PDM 404 begins reading record sets, at step 1050, the PDM 404 prefixes each record set with a prefix header 500 (see FIG. 5) for creating specific journal records (a journal record includes the prefix header 500 and the record set information 600). The journal records contain the control information (and records) necessary for forming consistency groups at the secondary site 431 (or at the primary site 421).

At step 1060 the PDM 404 transmits the generated journal records to the SDM 414 via the communications link 408 (or within the same data mover system if the consistency groups are formed therein). The SDM 414 uses the state table 700 at step 1070 to gather the received record updates by group and sequence numbers for each time interval group and primary storage controller 405 established for the data shadowing session. The SDM 414 inspects the journal records at step 1080 to determine whether all record information has been received for each time interval group. If the journal records are incomplete, then step 1085 causes the SDM 414 to notify the PDM 404 to resend the required record sets. If the PDM 404 is unable to correctly resend, then the duplex volume pair is failed. If the journal records are complete, then step 1090 is performed which encompasses the SDM 414 forming the consistency groups.

Referring to FIG. 11, steps 1100–1160 representing step 1090 (FIG. 10) for forming consistency groups is shown. Consistency group formation starts at step 1100 wherein each software consistency group is written to an SDM 414 journal log ("hardened") on the secondary DASD 417 (FIG. 4). Step 1110 performs a test for determining whether the time interval groups are complete, that is, each primary storage controller 405 must have either presented at least one read record set buffer or have confirmation from the PDM 404 that no such record updates were placed in the record set buffer, and all read record set buffers with data (or null) must have been received by the SDM 414. If a time interval group is incomplete, then step 1110 retries reading the record sets from the primary storage controller 405 until the required data is received. If errors occur, a specific duplex volume pair or pairs may be failed. Having received complete time interval groups, step 1120 determines a first consistency group journal record. The first (or current) consistency group journal record is that record which contains the earliest operational time stamp 502 and the earliest time of update 610 of all records having equal operational time stamps 502.

Step 1130 inspects the records contained in the current consistency group journal record to determine which record will be the last record to be included therein (some records will be dropped and included in the next consistency group journal record). The last record in the current consistency group journal record is determined as a minimum update time (min-time) of the maximum update times for each primary storage controller 405 (that is, the last update of each primary storage controller 405 is compared and only the earliest of these remains in the current consistency group journal record).

Those remaining record updates in the current consistency group journal record are ordered according to time of update 610 and sequence number within group 504 by step 1140. A primary storage controller 405 that had no record updates does not participate in the consistency group. At step 1150, the remaining record updates of the current consistency group (having update times later than min-time) are passed to the next consistency group. Each sequence number within a group 504 should end with a null buffer indicating that all read record sets have been read for that operational time interval. If the null buffer is absent, then the step 1120 of defining the last record in the current software consistency group, coupled with the records read time 507 and time of update 610 can be used to determine the proper order of the application WRITE I/O operations across the primary storage controllers 405.

Step 1160 represents a back-end of the remote data shadowing process wherein specific write updates are applied to secondary DASDs 416 under full disaster recovery constraint. If when writing the updates to the secondary DASDs 416 an I/O error occurs, or the entire secondary site 431 goes down and is re-initialized, then the entire consistency group that was in the process of being written can be re-applied from the start. This permits the remote shadowing to occur without having to track which secondary DASDs 416 I/Os have occurred, which I/Os have not occurred, and which I/Os were in process, etc.

SECONDARY I/O WRITES

A key component of step 1160 is that the PDM 414 causes the records to be written efficiently to the secondary DASDs 416 so that the secondary site 431 can keep pace with the primary site 421. The requisite efficiency is accomplished, in part, by concurrently executing multiple I/O operations to different secondary DASDs 416. Serially writing one secondary DASD 416 at a time would cause the secondary site 431 to fall to far behind the primary site 421. Yet more efficiency is gained at the secondary site 431 by writing the records for each consistency group destined for a single secondary device via a single channel command word (CCW) chain. Within each single CCW chain, the I/O operations therein can be further optimized as long as those I/O operations to each secondary DASD 416 data track are maintained in the order of occurrence on the primary volumes.

Optimizing secondary I/O operations for specific consistency groups and within single CCW chains is based in part upon the pattern of primary write I/O operations, and in part upon the physical characteristics of the secondary DASDs 416. Optimization may vary somewhat depending upon whether secondary DASD 415 is count/key/data (CKD), extended count/key/data (ECKD), fixed block architecture (FBA), etc. Consequently, a number of WRITE I/Os (m) to a primary DASD 406 volume during a given time interval can be reduced to a single START I/O operation to a secondary DASD 416 volume. This optimization of the number of START I/Os to the secondary storage controllers 415 of m:1 can allow the secondary DASDs 416 to catch up with and thereby closer shadow the record updates at the primary site 421.

A key to successful remote data shadowing, and hence secondary I/O optimization, is minimizing unrecoverable errors in any of the concurrent multiple I/O operations to secondary DASDs 416 so that consistent copies are available for recovery. A failure in a given secondary write could permit a later dependent write to be recorded without the conditioning write (e.g., a log entry indicating that a data base record has been updated when in reality the actual update write for the data base had failed violates the sequence integrity of the secondary DASD 416 copy).

A failed secondary 416 copy is unusable for application recovery until that failure to update has been recovered. The failed update could be corrected by having the SDM 414 request a current copy from the PDM 404. In the mean time the secondary data copy is inconsistent and hence unusable until the PDM 404 responds with the current update and all other previous updates are processed by the PDM 414. The time required to recover the failed update typically presents an unacceptably long window of non-recovery for adequate disaster recovery protection.

Effective secondary site 4311/0 optimization is realized by inspecting the data record sets to be written for a given consistency group and building chains based upon rules of the particular secondary DASD 416 architecture, for example, an ECKD architecture. The optimization technique disclosed herein simplifies recovery from I/O errors such that when applying a consistency group, if an I/O error occurs, the CCW chain can be re-executed, or in the event of a secondary initial program load (IPL) recovery, the entire consistency group can be re-applied without data loss.

FIG. 12 summarizes full consistency group recovery (FCGR) rules for building CCW chains for all WRITE I/O combinations for an ECKD architecture, wherein CCHHR record format is used (cylinder number, head number, record number). FIG. 12 is created by inspecting each possible combination of WRITE I/O operations to a DASD track within a consistency group's scope. The FCGR rules of FIG. 12, described in FIG. 13, are then followed to govern data placement (secondary DASD 416 I/O write CCW chains) for yielding full recovery for an error in applying a consistency group. The FCGR rules depicted in FIG. 12 would be extended appropriately as new WRITE I/O operations are added. These rules can exist in hardware or software at the secondary site 431. The FCGR rules advantageously reduces READ record set to a same DASD track analysis to an inspection of the primary DASD 406 WRITE I/O type, search argument, and count and key fields.

If a DASD track is written without inspecting the consistency group write operations as shown in FIG. 12, then previously written data records potentially cannot be rewritten. For example, assume that a chain includes:

WRITE UPDATE to record five; and

FORMAT WRITE to record one, wherein record one and record five occur on the same DASD track with record one preceding record five. Record five is updated by an UPDATE WRITE CCW and the FORMAT WRITE I/O CCW updates record one erasing a remainder of the track thus deleting record five. If this chain had to be re-executed, the LOCATE RECORD CCW that will position to the beginning of record five will no longer have a positioning point (record five no longer exists), and the chain is not fully recoverable from the beginning. Since the write operations have already been successful at the primary site 421, always being able to apply an entire consistency group on the secondary DASD 416 is required to maintain data consistency and integrity.

Figure 14:
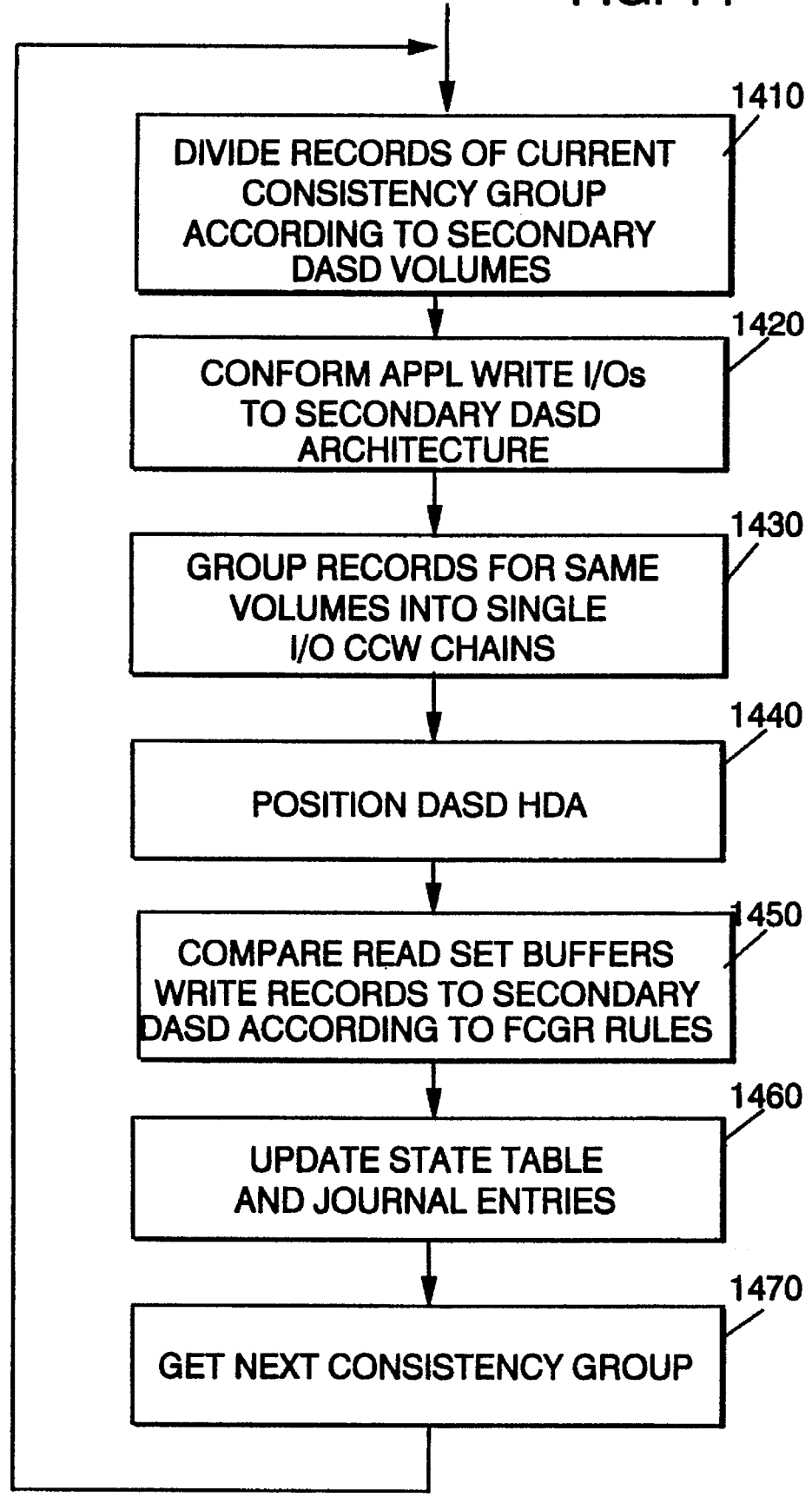
FIG. 14 is a flow diagram of a method of writing read record set copies to a secondary site with full consistency group recovery capability, in accordance with one embodiment of the invention.

FIG. 14, steps 1410 through 1470, provides more detail as to the process represented by step 1160 of FIG. 11, and using the FCGR rules defined in FIG. 12. At step 1410 the SDM 414 divides the records of the current consistency group into two categories. A first category includes I/O orders directed to a same secondary DASD volume, and a second category includes I/O orders those records in the first category that are directed to a same CCHH (i.e., records being updated to a same DASD track).

Having categorized the records of the current consistency group, step 1420 conforms application WRITE I/Os and SDM 414 WRITE I/Os to the architecture of the secondary DASDs 416, for example, to ECKD architecture FCGR rules (see FIG. 12) for identifying data placement on a track and track/record addressing. The SDM 414 groups secondary DASD WRITE I/O operations to the same volumes into single I/O CCW chains at step 1430. Step 1440 involves moving the head disk assembly (HDA) of each secondary DASD 416 according to search arguments and specific record data (CKD fields) for the actual secondary DASD 416 writes.

Step 1450 compares READ SET BUFFERS one and two for records making up the second categories (there typically will be a plurality of second categories, one for each track receiving records), using the FCGR rules of FIG. 12 for determining whether a subsequent write operation invalidates a previous write operation or DASD search argument (portioning at a record that is now erased, etc.). Following the FCGR rules ensures that the SDM 414 can re-write an entire consistency group, in the event of an error, without re-receiving record updates from the primary site 421. After the SDM 414 applies the current consistency group to the secondary DASD 416, step 1460 updates the state table (FIG. 7) and the master journal (FIG. 8).

The remote copy process continues in real time as step 1470 gets a next consistency group (which becomes the current consistency group) and returns processing to step 1410. The remote copy process will stop if the primary site 421 to secondary site 431 communication terminates. The communication may terminate if volume pairs are deleted from the process by the PDM 404, the primary site is destroyed (disaster occurs), an orderly shutdown is performed, or a specific takeover action occurs at the secondary site 431. Consistency groups journaled on the secondary site 431 can be applied to the secondary DASD 416 during a takeover operation. The only data lost is that data captured by the primary site 421 that has not been completely received by the SDM 414.

In summary, synchronous and asynchronous remote data duplexing systems have been described. The synchronous remote data duplexing system provides storage based, real time disaster recovery capabilities, wherein the remote data duplexing system includes a primary site and a secondary site. The secondary site synchronously receives write I/O updates from the primary site for data shadowing, while the secondary site is located several kilometers remote from the primary site such that in the event that a disaster disables the primary site, the secondary site can provide real time data availability. A primary processor at the primary site supports a plurality of applications, wherein the plurality of applications cause the write I/O updates. A plurality of primary storage controllers receive the write I/O updates and cause the write I/O updates to be written to a plurality of primary storage devices. A secondary processor at the secondary site is coupled to the primary processor by a data link, and a plurality of secondary storage controllers at the secondary site, are coupled to the secondary processor and further coupled to the plurality of primary storage controllers via a plurality of fiber optic links, the plurality of secondary storage controllers providing a storage based duplex pair for shadowing the write I/O updates. A plurality of secondary storage devices receive the write I/O updates from the plurality of secondary storage controllers in the order received from the plurality of primary storage controllers.

An I/O and error recovery program in the primary processor communicates with the plurality of secondary storage controllers, the I/O and error recovery program taking control over from said plurality of applications in the event that a failed duplex occurs, the I/O and error recovery program providing a failed duplex message to the primary processor and plurality of secondary storage controllers regarding the nature of the failed duplex while providing error recovery. The I/O and error recovery program prevents further I/O write updates while providing a status to primary and secondary processors in the event error recovery was unsuccessful.

While the invention has been particularly shown and described with reference to preferred embodiments thereof, it will be understood by those skilled in the art that various changes in form and details may be made therein without departing from the spirit and scope of the invention. For example, the communication links between primary and secondary processors and between primary and secondary storage controllers may vary. For example, distances separating the primary and secondary sites in synchronous remote duplexing mode may increase with improved communication links in future embodiments of the invention without departing from the teachings herein.

What is claimed is:

1. A method for providing remote data shadowing, wherein a primary site includes a primary processor coupled to a primary storage subsystem, said primary processor running at least one application therein causing I/O write updates to the primary storage subsystem, said primary processor further having an I/O error recovery program (I/O ERP) running therein, a secondary site includes a secondary processor coupled to a secondary storage subsystem, said secondary site synchronously shadowing the I/O write updates and said secondary storage subsystem communicating with the I/O ERP; said method comprising steps of:

(a) sending the I/O write updates from said primary storage subsystem to said secondary storage subsystem;

(b) determining whether a duplex pair is established between said primary and secondary storage subsystems;

(c) reporting a failed duplex pair from the primary storage subsystem to the primary processor;

(d) transferring primary processor control from the at least one application to the I/O ERP when failed duplex occurs;

(e) issuing a sense I/O, from the I/O ERP to the primary storage subsystem, prompting the primary storage subsystem to determine a cause of the failed duplex pair; and (f) sending a failed duplex message, from the I/O ERP to the secondary storage subsystem.

2. The method for providing remote data shadowing according to claim 1 wherein said primary storage subsystem continues to write updates when the duplex pair status is established or recovered.

3. The method for providing remote data shadowing according to claim 2 wherein step (c) includes said primary storage subsystem reporting an I/O status channel end/ device end/unit check to said primary processor when reporting the failed duplex pair.

4. The method for providing remote data shadowing according to claim 2 further comprising a step (g) for performing error recovery by the I/O ERP and maintaining data integrity at the secondary site when failed duplex occurs.

5. The method for providing remote data shadowing according to claim 4 further comprising a step (h) for returning control from the I/O ERP to the at least one application after the error recovery successfully completes.

6. The method for providing remote data shadowing according to claim 5 further comprising a step (i) for sending a failed synchronous remote copy message, via the I/O ERP, to the secondary site if the error recovery was unable to complete successfully.

7. The method for providing remote data shadowing according to claim 6 wherein the step (i) further prevents subsequent I/O writes to the primary storage subsystem.

8. The method for providing remote data shadowing according to claim 4 wherein communication for the error recovery occurs between the primary processor and the secondary processor.

9. The method for providing remote data shadowing according to claim 4 wherein communication for the error recovery occurs between the primary storage subsystem and the secondary storage subsystem.

10. A remote data duplexing system having a primary site and a secondary site, the secondary site receiving write updates from the primary site for data back-up, the secondary site being located sufficiently remote from said primary site that in the event that a disaster occurs preventing data access at the primary site, the secondary site can provide real time data availability, the remote data duplexing system comprising:

a primary processor at the primary site running at least one application generating write I/O updates;

a primary storage subsystem for receiving and storing the write I/O updates;

a secondary processor at the secondary site coupled to the primary processor by a data link;

a secondary storage subsystem at the secondary site, coupled to the secondary processor and further coupled to the primary storage subsystem via communication links, the secondary storage subsystem providing a storage based duplex pair for back-up of the write I/O updates wherein the write I/O updates are written to the secondary storage subsystem in the specific synchronous order received; and error recovery means in the primary processor and coupled to the secondary storage subsystem for providing error recovery if a failed duplex occurs, wherein the error recovery means quiesces the application running on the primary processor and issues a sense I/O to the primary storage subsystem to determine a cause of the failed duplex.

11. The remote data duplexing system according to claim 10 wherein the error recovery means reports a failed duplex mode to both the primary processor and secondary site.

12. The remote data duplexing system according to claim 10 wherein the error recovery means returns control back to the application running on the primary processor after error recovery means completes error recovery and duplex mode is re-established.

13. The remote data duplexing system according to claim 12 wherein the error recovery means prevents further primary secondary storage subsystem write I/O updates if the error recovery means is unable to successfully complete error recovery.

14. The remote data duplexing system according to claim 10 further comprising:

a primary console coupled to the primary processor for receiving error messages from the error recovery means; and a secondary console coupled to the secondary processor for receiving the error messages from the error recovery means.

15. The remote data duplexing system according to claim 10 wherein the primary and secondary storage subsystems each include a plurality of storage controllers.

16. The remote data duplexing system according to claim 15 wherein the communications link includes a plurality of enterprise systems connections (ESCON) links.

17. A remote data duplexing system provides storage based, real time disaster recovery capabilities, the remote data duplexing system having a primary site and a secondary site, the secondary site synchronously receiving write I/O updates from the primary site for data shadowing, the secondary site being located sufficiently remote from the primary site such that in the event a disaster prevents data access at the primary site, the secondary site can provide real time data availability, the remote data duplexing system comprising:

a primary processor at the primary site running a plurality of applications, the plurality of applications generating the write I/O updates;

a plurality of primary storage controllers for receiving the write I/O updates;

a plurality of primary storage devices for storing the write I/O updates;

a secondary processor at the secondary site coupled to the primary processor by a data link;

a plurality of secondary storage controllers at the secondary site, coupled to the secondary processor and further coupled to the plurality of primary storage controllers via a plurality of fiber optic links, the plurality of secondary storage controllers providing a storage based duplex pair for shadowing the write I/O updates wherein the write I/O updates are provided to the secondary storage subsystem in the order generated;

a plurality of secondary storage devices coupled to the plurality of secondary storage controllers for storing the write I/O updates thereon; and error recovery means in the primary processor and coupled to the plurality of secondary storage controllers for taking control from said plurality of applications in the event that a failed duplex occurs, the error recovery means quiescing said plurality of applications and prompting said plurality of primary storage controllers to determine a cause of the failed duplex, the error recovery means further providing a failed duplex message to the primary processor and plurality of secondary storage controllers regarding the cause of the failed duplex while continuing to provide error recovery, the error recovery means also preventing further I/O write updates and providing status to primary and secondary processors in the event error recovery was unsuccessful.

* * * * *